United States Patent
Junkar et al.

(10) Patent No.: US 7,253,767 B1
(45) Date of Patent: Aug. 7, 2007

(54) FLAT MODEL SOFTWARE COMPENSATED CRYSTAL OSCILLATOR FOR GPS RECEIVER

(76) Inventors: Martin Junkar, 423 Studio Cir., Apt. 1, San Mateo, CA (US) 94401; Johan Bergerengen, 81 Lansing St., San Francisco, CA (US) 94114

( * ) Notice: Subject to any disclaimer, the term of this patent is extended or adjusted under 35 U.S.C. 154(b) by 106 days.

(21) Appl. No.: 11/217,693

(22) Filed: Sep. 1, 2005

(51) Int. Cl.
*G01S 1/00* (2006.01)
*H03L 1/00* (2006.01)

(52) U.S. Cl. .................. 342/357.02; 331/175
(58) Field of Classification Search ........... 342/357.02; 331/175–176
See application file for complete search history.

(56) References Cited

U.S. PATENT DOCUMENTS 6,420,938 B1 * 7/2002 Hoff et al. ................. 331/176

* cited by examiner

*Primary Examiner*—Thomas H. Tarcza
*Assistant Examiner*—Nga X. Nguyen
(74) *Attorney, Agent, or Firm*—Law Offices of Thomas E. Schatzel

(57) ABSTRACT

A GPS receiver comprises a crystal oscillator with a manufacturer's characteristic curve, a GPS radio, a TCO temperature sensor, and a GPS receiver software. The crystal oscillator serves as a local reference oscillator for the GPS radio. The GPS receiver software instructs the GPS radio to search radio spectrum for GPS satellite transmissions. Once the combination locks onto a minimum number of GPS satellites and produces a user position fix, the precise crystal oscillator frequency can be measured and associated with a temperature reading from the TCO to software-compensate the local oscillator in later cold-start frequency searches. A "flat" SCXO model is piecemeal upgraded with individual calibrations as they are collected over the life of the GPS receiver. During manufacturing of the GPS receiver such flat-SCXO model begins as a device characteristic curve supplied by the crystal manufacturer.

4 Claims, 2 Drawing Sheets

FLAT MODEL SOFTWARE COMPENSATED CRYSTAL OSCILLATOR FOR GPS RECEIVER

FIELD OF THE INVENTION

The present invention relates to navigation satellite receivers, and more particularly to methods and systems for improving the time-to-first-fix (TTFF) by reducing the frequency uncertainty associated with local crystal oscillators.

DESCRIPTION OF THE PRIOR ART

Commercial oscillator crystals are available with frequency stabilities on the order of one-part-per-million (1-ppm) to 100-ppm. In the past, this was considered good in most receiver local oscillator applications. But global positioning system (GPS) receivers need local reference oscillator frequency stabilities that are much better then 1-ppm. Crystals are in particular sensitive to their operating temperatures, so temperature variations cause a major source of frequency error in GPS receivers.

When a GPS receiver comes up from a cold start, it must begin a frequency search to find GPS satellite transmissions. Relatively large frequency uncertainties can result from local reference oscillator crystal errors. Prior art GPS receivers have resorted to using highly accurate crystals, but these can be very costly. One conventional approach has been to place the crystals in ovens that keep their temperatures constant during use.

During GPS receiver manufacture, a temperature "sweep" of the individual crystal can be made while logging the oscillation frequency at each temperature point. These readings are used later in post processing to back out the temperature induced frequency uncertainties. Once this characteristic curve or model has been ascertained at the factory, a software correction (SCXO) model is locked into the GPS receiver and does not change. For example, a conventional SCXO is described by Lawrence Hoff, et al., in U.S. Pat. No. 6,420,938, issued Jul. 16, 2002.

Commercially marketed crystals are batch characterized by their manufacturers and guaranteed to have a temperature-frequency characteristic that falls within certain limits. Frequency stability is normally specified as a frequency tolerance over a defined operating temperature range with respect to the frequency at reference temperature. The temperature ranges are defined for each crystal in the relevant data sheet. For example, a typical frequency tolerance for an AT-cut crystal operating in the 15.0-30.0 MHz range is 25° C.±2° C. The frequency stability for such is published as being ±5 ppm for 0° C. to 50° C., ±5 ppm for −10° C. to 60° C., ±10 ppm for −20° to 70° C., ±20 ppm for −30° C. to 80° C., ±25 ppm for −40° C. to 90° C., ±50 ppm for −55° C. to 105° C., and ±50 ppm for −55° to 125° C. Typical aging is ±3 ppm per year, so the baseline can shift over time and have an offset at the nominal temperature of 25° C.

During manufacturing quality assurance tests, units that fall outside these published parameters are culled out. Such characteristic curves are generally in the form of an "S" laying on its side, and the middle point of the curve can be essentially flat in its delta-frequency to delta-temperature changes. The angle of cut of the quartz blank from its quartz stone determines which curve will be followed. The chosen angle being subject to its own tolerance. Since manufacturing cost is tolerance-dependent, it is best not to specify a wider operating temperature range then is actually needed unless some sacrifice of stability, or an increase in cost, can be accepted. One significant frequency error that occurs often is a baseline shift of such "S" curve up or down in frequency. Removing such baseline shift from the overall frequency uncertainty can result in an order of magnitude improvement.

SUMMARY OF THE INVENTION

Briefly, a GPS receiver embodiment of the present invention comprises a crystal oscillator with a manufacturer's frequency error specification, a GPS radio, a TCO temperature sensor, and a GPS receiver software. The crystal oscillator serves as a local reference oscillator for the GPS radio. The GPS receiver software instructs the GPS radio to search radio spectrum for GPS satellite transmissions. Once the combination locks onto a minimum number of GPS satellites and produces a user position fix, the precise crystal oscillator frequency can be measured and associated with a temperature reading from the TCO to software-compensate the local oscillator in later cold-start frequency searches. A "flat" SCXO model and its frequency error (sigma) is piecemeal upgraded with individual calibrations as they are collected over the life of the GPS receiver. During manufacturing of the GPS receiver, such flat-SCXO model begins as a 0-offset flat model and device characteristic frequency error specification supplied by the crystal manufacturer.

An advantage of the present invention is that a GPS receiver and method are provided that improves the time required to produce a first position fix.

Another advantage of the present invention is that a GPS receiver and method are provided for relaxing the frequency stability limits of crystals that can be used in commercial products, and thereby reduce manufacturing costs.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENT

Figure 1:
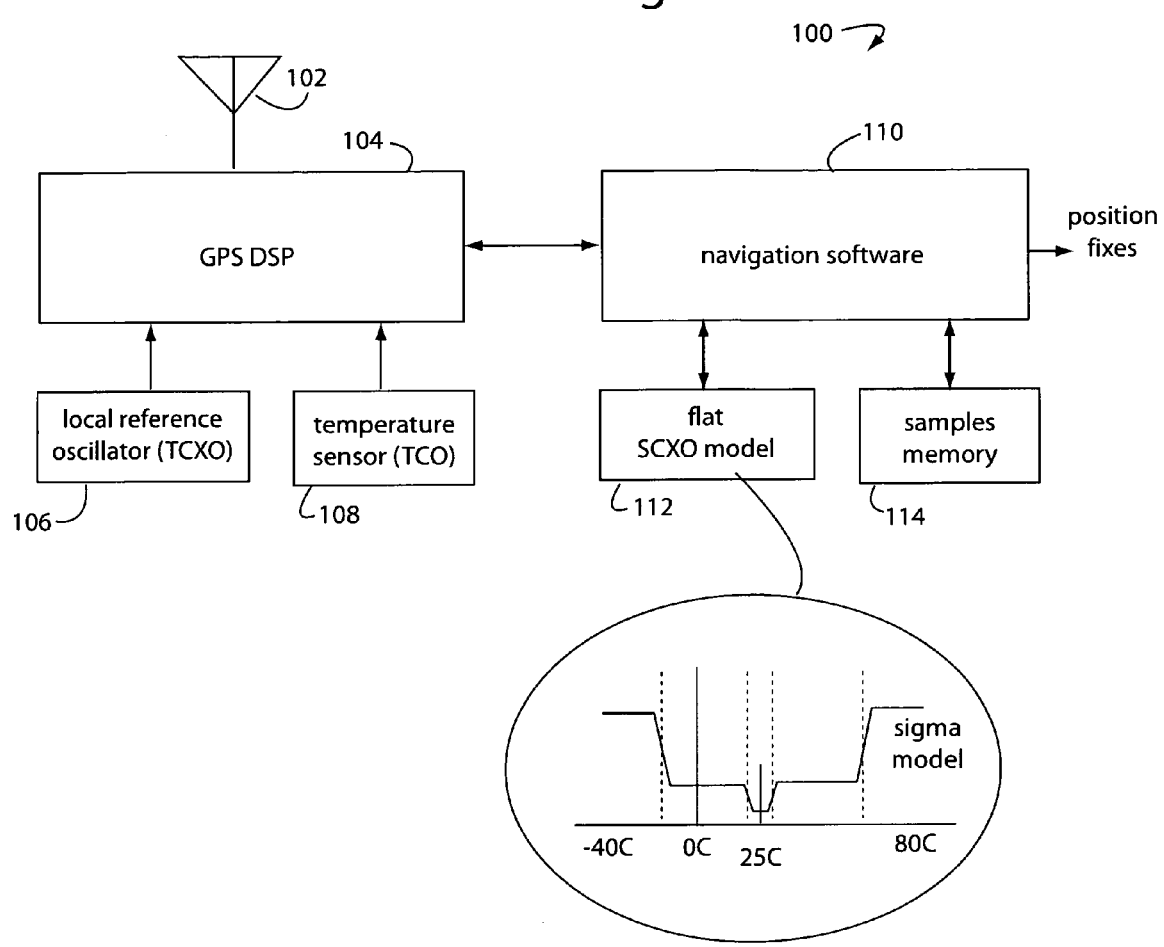
FIG. 1 is a functional block diagram of a GPS receiver embodiment of the present invention.

FIG. 1 illustrates a GPS receiver embodiment of the present invention, and is referred to herein by the general reference numeral 100. The GPS receiver 100 comprises an antenna 102 to receive the microwave transmissions of orbiting GPS satellites, and a GPS digital signal processor (DSP) 104 to tune and demodulate these signals. A local reference oscillator 106 includes a temperature compensated crystal oscillator (TCXO). Its temperature is measured by a temperature sensor 108, e.g., a temperature controlled oscillator (TCO) that outputs a frequency proportional to environmental temperature. A navigation software 110 interacts with the GPS DSP 104 to find the carrier frequencies of the GPS satellite transmissions, and to demodulate and correlate navigation information to produce user position fixes and to lock onto GPS system time. Once that occurs, the GPS receiver 100 has available very precise time and frequency information, and such can be used to accurately gauge the frequency error of TCXO 106.

In GPS receiver 100, the quality of the estimate of the true frequency generated by TCXO oscillator 106 directly affects the time-to-first-fix (TTFF), e.g., the delay from a cold start to the outputting of a first user position fix. This is because a frequency search must allow for both Doppler shift uncertainties and local reference oscillator error. Using a "flat" software model (SCXO) 112 can help improve performance, and low-cost TCXO oscillators 106 can be used where they could not before.

Building a conventional SCXO model for each GPS receiver is a time consuming process at the factory, and thus expensive. The flat-SCXO model 112 presents a cost advantage in a manufacturing process, while still retaining most benefits of having a full SCXO model. Instead of sweeping the whole operating temperature range, the flat-SCXO model 112 is initialized with the crystal manufacturer's oscillator specifications and an algorithm computes parameters at runtime after the GPS receiver produces position fixes. Periodically according to an algorithm, measurements are stored in a sample memory 114.

Such model 112 is called flat because a single offset value is used for the entire operating temperature spectrum. a confidence value, sigma, is attached to various sub-ranges of the overall operating temperature spectrum to indicate the variance in the offset value. The prior art SCXO models attempt to associate a variety of frequency offset values according to particular temperatures within the operating temperature spectrum.

It is important to make judicious use of sample memory 114 because data memory, in general, in portable devices is limited because it is expensive to provide and use. Such memory is therefore used to store statistics about the measurements, e.g., data averages and deviations.

In embodiments of the present invention, the flat-SCXO model 112 helps provide estimates of the local oscillator's drift during power-up and before a first user position fix. The drift is frequency error of local oscillator from its nominal frequency, e.g., drift=f−f0, where $f_0$ is nominal frequency of the crystal oscillator and f is the actual frequency generated by the crystal oscillator. Drift is generally a function of temperature. Such actual frequency f can only be determined after the GPS receiver is locked onto the GPS system time. But an estimate of f is needed in order to get the GPS receiver to lock in the first place, Catch-22. Improving the estimate of this frequency means a smaller uncertainty (sigma). A smaller sigma reduces the time needed to tune to the GPS satellite transmissions because less frequency spectrum has to be searched.

Temperature-compensated crystal oscillators (TCXO) have a static offset in addition to their temperature-related instability. Such static offset is usually expressed in manufacturer's datasheets as a frequency offset from a nominal frequency at some reference temperature, e.g., 1 ppm @ 25° C. A second major source of frequency error is dynamic-temperature dependent error, which is also specified for the batch or product series by the manufacturer.

The flat-SCXO model 112 is a zero-order math model that describes oscillator drift, e.g., a baseline error from the nominal frequency. No higher order polynomial coefficients are included. Such model comprises an offset parameter $A_0$ that is same for all temperatures. A drift sigma σ describes how accurate the estimated drift is within various temperature regions, or bins, partitioned within the operating temperature range. For example, sigma σ will be minimum in the temperature region of 25° C.±2° C. A middle value sigma σ will be computed outside this but still within 25° C.±25° C. And a third highest sigma value σ will be computed for the regions outside the first two. The three "bins" described here are merely for example, other numbers of bins can be used depending on the data storage capacity available to the model.

A typical flat-SCXO model 112 will simply comprise one $A_0$ offset term, and a few sigma values that are to be used in respective temperature regions. During a cold start, the navigation software 110 measures temperature with TCO 108, and reads from the flat-SCXO model 112 the running $A_0$ and the present temperature dependent value of sigma. The sigma value will directly dictate how wide the frequency search during initialization must be. As a consequence, it can be expected that the sigma will be minimum at the reference temperature of 25° C.±2° C., and the TTFF will be best because minimum uncertainties exist and the GPS receiver can search a smaller spectrum.

Once the GPS receiver 100 starts producing position fixes, the frequency errors of TCXO 106 at different temperatures measured by TCO 108 can be used to periodically update the statistics.

In the model, $A_0$ represents the median offset of the frequency versus temperature curve of TCXO 106. A frequency sigma is computed for different regions of temperature range frequency slope for different temperature ranges. For best performance, the operating temperature range is partitioned into several sub-sections.

A flat-SCXO model includes self learning and dynamic adjustments, low maintenance, low memory/processing requirements, fast operation, good performance, even with low cost oscillators. It uses GPS signal for calibration and updates of the model.

In order to generate the flat-SCXO model 112, the GPS receiver 100 has to first acquire a position-fix. Only during such times will it have very a accurate frequency reference, the GPS system time. Such reference is then used to compute the actual frequency of the local reference oscillator TCXO 106. To track GPS signals, the GPS receiver 100 computes the offset from its oscillator nominal frequency $f_0$ and then uses it to track GPS signal from satellites. This means, that at any time when GPS receiver computes position fix, it also has very exact information about its crystal frequency offset—Drift. At the same time the temperature sensor provides information about current temperature of the oscillator. Such pair of information is called a drift sample data. A flat-SCXO model generation algorithm then collects such drift samples over time and over different temperature ranges. It filters them, computes average and the result of these operations is $A_0$ term.

Figure 2:
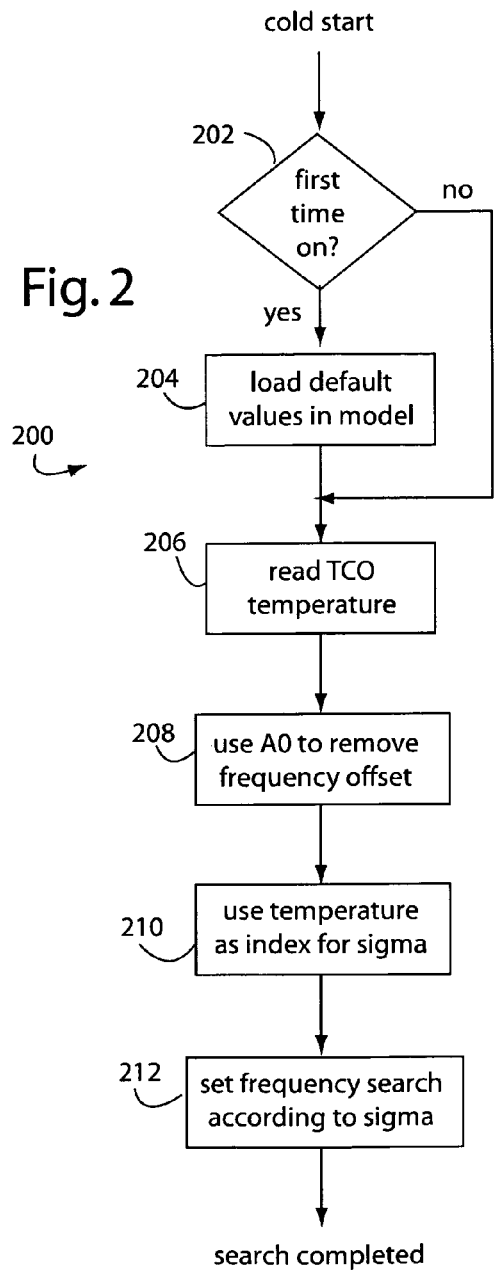
FIG. 2 is a flowchart diagram of a method embodiment of the present invention for initializing the GPS receiver of FIG. 1 with a flat SCXO model.

FIG. 2 represents a method embodiment of the present invention, and is referred to herein by the general reference numeral 200. The method 200 begins with a step 202 at a cold-start, power up of the GPS receiver. Step 202 determines if this is the first time the GPS receiver has been powered up after being manufactured. If so, a step 204 uses the crystal manufacturer's specifications as default values for an initial flat-SCXO model 112. The samples memory 114 is cleared. A step 206 reads temperature from TCO 108. A step 208 uses $A_0$ from the flat-SCXO model 112 to remove any baseline frequency offset in TCXO 106, regardless of temperature. A step 210 users the temperature reading obtained in step 206 to select the corresponding sigma value from the flat-SCXO model 112. Such sigma value is used in a step 212 to set how wide the frequency search for GPS satellite transmission carriers needs to be.

Figure 3:
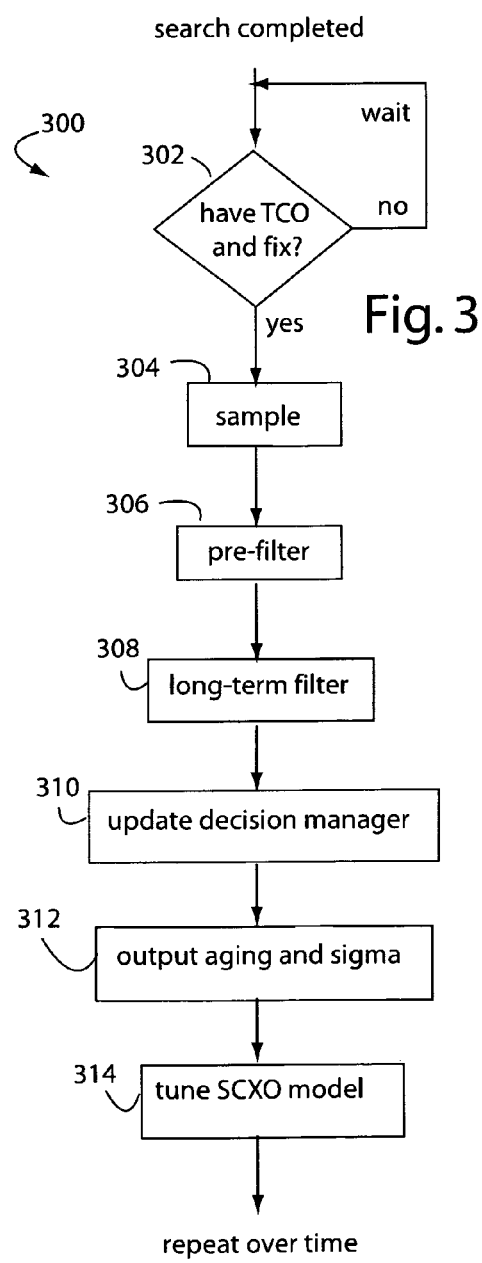
FIG. 3 is a flowchart diagram of another method embodiment of the present invention for updating the flat SCXO model in the GPS receiver of FIG. 1.

FIG. 3 represents an aging update process 300 which manages data sampling, filtering, aging update calculations, and flat-SCXO model updates. A step 302 is a loop that waits for a first position fix and a new temperature reading from TCO 108. In a step 304, samples are taken of (1) the current temperature, (2) the current oscillator drift, (3) the current DriftSigma (fix drift source), and the current Speed (fix).

A step 306 pre-filters the new drift samples before they are added to the samples memory 114. It validates samples and rejects noisy data to improve performance and accuracy of the model. The pre-filter can be set tight or loose, e.g., thresholds are used that are raised and lowered. Particular values of samples must exceed certain thresholds before the data will be accepted. All the thresholds are initialized the first time an aging update is run. After such initialization, only MaxAbsDriftError requires maintenance. It is set to the current ScxoSigma since the FreqOffsetSigma is updated at each aging update and propagated with time elapsed since last update thereafter. The propagation can be calculated in the pre-filter step 306 with MaxFreqAgingRate. The MaxAbsDriftError is maintained to be less then a predefined threshold. Other valuable information computed can include frequency offset sigma, frequency stability sigma, and frequency slope. Such can be combined with specifications from oscillator manufacturer, such as frequency hysteresis, temperature reference point, and frequency drift maximum aging rate.

A long-term filter step 308 organizes incoming samples of DriftErrors into certain temperature-interval averaged drift errors. A log is stored into previous-run-data. The temperature-interval-list settings are maintained all during the sampling time and up until the actual update. Such history list is cleared any time the settings have been modified. The list is initialized from previous-run-data. If API variables present a different TempRefPoint or different TempUpdateRange, the history will be cleared/reset.

An update decision manager step 310 maintains several parameters. Updates depend on whether it is a calibration run (manufacturing/recovery), the time since the last update, which temperature range the last sample was from, and the quality and quantity of the sample average. For example, the variance and average with respect to aging rate and sigma. timeForUpdate=f(timeSinceLastUpdate, binLastUpdated, nSamples, variance, average, manufacturing/recovery mode).

A step 312 calculates the aging and sigma updates. The flat-SCXO model is tuned up, up dated, in a step 314. Such updated flat-SCXO model 112 will be available to method 200 (FIG. 2), the next time GPS receiver 100 is powered up. Specifically, the updated flat-SCXO model 112 will have a more exact value for A0, and tighter (lower) values of sigma for any if not all of the bins in the operating temperature range. Both of these will contribute to faster TTFF because the spectrum being searched can be narrowed over the previous searches.

Embodiments of the present invention provide good oscillator frequency estimates, which in-turn improve performance of the GPS receiver. Such also provide a low-cost and low-maintenance solution that requires very little computation and storage space, they allow use of low-cost oscillators.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the "true" spirit and scope of the invention.

What is claimed is:

1. A method of compensating the initial search by a digital signal processor for carrier frequency lock in software for frequency errors caused by operating temperature instabilities in a crystal oscillator in a GPS receiver, comprising:

installing a flat software correction model in a particular GPS receiver such that a single static frequency-offset value is included for an entire operating temperature spectrum, and a confidence value, sigma, is attached to various sub-ranges of said operating temperature spectrum to indicate a variance in said offset value;

initializing said flat software correction model once during the manufacture of a particular GPS receiver with frequency-versus-temperature data provided by a manufacturer of a local crystal reference oscillator (TCXO);

thereafter during operation, reading a current operating temperature with a temperature sensor (TSO) and using it as an index to select a corresponding static frequency-offset ($A_0$) and sigma values from said flat software correction model that represent how much offset to use and how wide a frequency search should be made by navigation software given the frequency uncertainties expected at a particular TCXO operating temperature;

using said static frequency-offset ($A_0$) and sigma values to initialize said navigation software in a cold start radio spectrum search to find GPS satellite transmissions and obtain a first position fix; and updating selected entries in said software correction model in run time with information derived from precise time and frequency information that becomes available from said particular GPS receiver after it produces user position fixes and locks onto GPS system time and can accurately gauge any frequency errors of said TCXO at certain operating temperatures then read by said TSO;

wherein, the actual frequency of operation of said TCXO is not corrected, and only where-to-search for GPS satellite transmissions in a down-converted radio spectrum is affected; and wherein, each said updating improves future time-to-first-fix (TTFF) delays from a cold start of the GPS receiver.

2. The method of claim 1, further comprising:

computing a single static frequency offset value $A_0$ for all operating temperatures;

measuring a current operating temperature and associating a sigma with various temperature sub-ranges;

updating said flat software correction model with said static frequency offset value $A_0$, and said sigma with respect to said various temperature sub-ranges.

3. The method of claim 1, further comprising:

judicious use of a sample memory used to store statistics gathered in the step of updating selected entries, wherein said statistics include data averages and deviations about measurements.

4. The method of claim 1, further comprising:

limiting said sigma values to one of three discrete values with a minimum value representing a temperature sub-range around 25° C., a middle value representing a temperature sub-range just outside said 25° C. sub-range, and a highest value representing a temperature sub-range at the highest and lowest outer bounds of the operating temperature range of said TCXO.

* * * * *